(12) United States Patent
Kumar et al.

(10) Patent No.: US 9,467,125 B2
(45) Date of Patent: Oct. 11, 2016

(54) CMOS SCHMITT TRIGGER CIRCUIT AND ASSOCIATED METHODS

(71) Applicant: STMicroelectronics International N.V., Amsterdam (NL)

(72) Inventors: Vinod Kumar, Pratapgarh (IN); Saiyid Mohammad Irshad Rizvi, New Delhi India (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 56 days.

(21) Appl. No.: 14/573,129

(22) Filed: Dec. 17, 2014

(65) Prior Publication Data
US 2016/0182022 A1    Jun. 23, 2016

(51) Int. Cl.
*H03K 3/3565* (2006.01)

(52) U.S. Cl.
CPC ................................. *H03K 3/3565* (2013.01)

(58) Field of Classification Search
CPC .......................... H03K 3/0377; H03K 3/3565
See application file for complete search history.

(56) References Cited

U.S. PATENT DOCUMENTS

| | | | |
|---|---|---|---|
| 6,624,678 B1 * | 9/2003 | Boutaud | H03K 3/0375 327/206 |
| 2005/0104641 A1 * | 5/2005 | Chen | H03K 3/3565 327/205 |

OTHER PUBLICATIONS

V. Kumar, M. Rizvi, "Power Sequence free 400Mbps 90μW 6000μm2 1.8V-3.3V Stress Tolerant I/O Buffer in 28nm CMOS," in Proceedings of the ESSCIRC, 2013, pp. 37-40.
C.-C. Wang, C.-H. Hsu, and Y.-C. Liu, "A 1/2 X VDD to 3 X VDD bidirectional I/O buffer with a dynamic gate bias generator," IEEE Trans. Circuits Syst. I, Regular Papers, vol. 57, No. 71, pp. 1642-1653, Jul. 2010.

* cited by examiner

*Primary Examiner* — Patrick O'Neill
(74) *Attorney, Agent, or Firm* — Allen, Dyer, Doppelt, Milbrath & Gilchrist, P.A.

(57) ABSTRACT

The Schmitt trigger circuit includes a signal input, a first inverter coupled to the signal input and configured to operate at a first voltage, and a second inverter coupled downstream of the first inverter and configured to operate at a second voltage lower than the first voltage. A protection device is coupled between the first inverter and the second inverter, and configured to limit a voltage input to the second inverter at the second voltage. A feedback circuit is coupled downstream of the protection device between the first inverter and the second inverter and configured to introduce hysteresis. An output circuit is coupled to the second inverter and configured to provide an output signal at the second voltage. The approach provides an architecture for 3.3V receivers designed by using 1.8V devices, without active power consumption from the I/O PAD during transition, and/or that supports CMOS standard levels for 1.8V and 3.3V receivers.

21 Claims, 4 Drawing Sheets

CMOS SCHMITT TRIGGER CIRCUIT AND ASSOCIATED METHODS

FIELD

The present invention relates to the field of Complementary metal-oxide-semiconductor (CMOS) VLSI circuits and, more particularly, to input/output (I/O) receivers and related methods.

BACKGROUND

In nanometer CMOS technologies such as 28 nm, the maximum tolerable voltage limit for thick-oxide devices is 1.98V. However, there are number of peripheral devices which are still operating at voltages which are higher than the nominal operating voltage of the devices, for example up to 3.6V. Therefore, the need arises to design the receiver by using low voltage devices which can receive the signal up to 3.6V from external peripheral devices and down convert it to the nominal operating voltage range of the devices. Since the external input signal to the receiver is noisy, a Schmitt trigger circuit may be needed to stop noise of the signal from propagating inside the receiver.

For 3.3V receivers there are two kinds of industry standards (e.g. JEDEC Solid State Technology Association) available for the receiver. The TTL standard includes: Logic Low (VIL)≤0.8V; and Logic High (VIH)≥2.0V. The CMOS standard includes: Logic Low (VIL)≤0.35*VDDE; and Logic High (VIH)≥0.65*VDDE.

Applications include the TTL standard being followed for 3.3V receivers whereas there are also many applications where the CMOS standard is being followed. However, the conventional 3.3V CMOS receiver architecture available includes the following constraints: there is active power consumption from PAD during the transition which can lead to operational failures; and the conventional architecture of 3.3V receivers designed by using 1.8V devices cannot support the CMOS standard if the threshold voltage of the CMOS devices used for Schmitt design are of the order of 0.5V and higher.

SUMMARY

The present embodiments are directed to a Schmitt trigger circuit including a signal input, a first inverter coupled to the signal input and configured to operate at a first voltage, and a second inverter coupled downstream of the first inverter and configured to operate at a second voltage lower than the first voltage and may be internally generated from the first voltage by using an internal reference voltage generator circuit. A protection device is coupled between the first inverter and the second inverter, and configured to limit a voltage input to the second inverter at the second voltage. A feedback circuit is coupled downstream of the protection device between the first inverter and the second inverter and configured to introduce hysteresis. An output circuit is coupled to the second inverter and configured to provide an output signal at the second voltage.

The first inverter may include a plurality of transistor devices configured to operate at the second voltage and coupled together, e.g. a series of cascode coupled transistor devices. Such a series of cascade coupled transistor devices of the first inverter may be coupled between a supply voltage and ground. The protection device may include a transistor clipping circuit controlled by a first reference voltage which corresponds to the second voltage. The first inverter, the second inverter, the protection device, the feedback circuit and the output circuit may each comprise 1.8V transistor devices, and the first voltage level is 3.3V. Also, the feedback circuit may be a positive feedback latch.

The advantages of the embodiments provide an architecture for 3.3V receivers designed by using 1.8V devices, without active power consumption from the I/O PAD during transition, and/or that supports CMOS standard levels for 1.8V and 3.3V receivers.

A CMOS input/output (I/O) receiver includes an I/O pad, the Schmitt trigger circuit coupled to the I/O pad, a down level shifter device coupled to the Schmitt trigger circuit, and an internal reference voltage generator configured to generate reference voltages for the Schmitt trigger circuit and the down level shifter device based upon a supply voltage. The internal reference voltage generator may be placed centrally in the chip and the generated reference voltage signals will be routed to each I/O receiver in the I/O ring.

A method aspect is directed to implementing a Schmitt trigger circuit, the method comprising: coupling a first inverter, configured to operate at a first voltage, to a signal input; coupling a second inverter downstream of the first inverter and configured to operate at a second voltage lower than the first voltage; coupling a protection device between the first inverter and the second inverter to limit voltage input to the second inverter at the second voltage; coupling a feedback circuit downstream of the protection device between the first inverter and the second inverter to introduce hysteresis; and coupling an output circuit to the second inverter to provide an output signal at the second voltage.

DETAILED DESCRIPTION

The present embodiments will now be described more fully hereinafter with reference to the accompanying drawings, in which preferred embodiments are shown. The embodiments may, however, have many different forms and should not be construed as limited to the embodiments set forth herein. Rather, these embodiments are provided so that this disclosure will be thorough and complete, and will fully convey the intended scope to those skilled in the art. Like numbers refer to like elements throughout.

Figure 1:
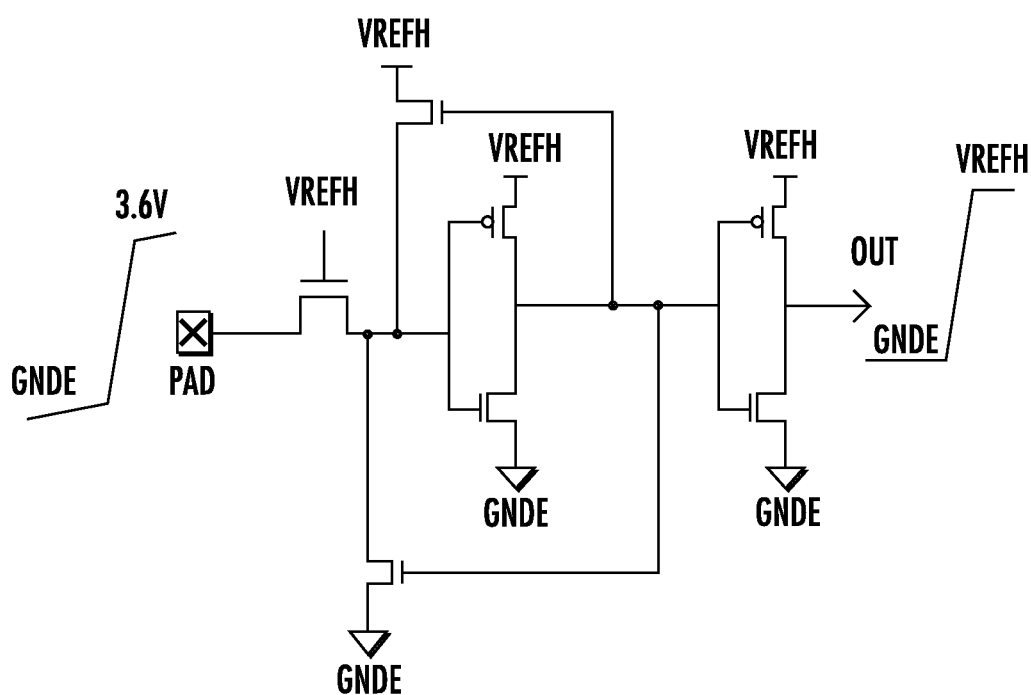
FIG. 1 is a schematic diagram illustrating a Schmitt trigger circuit according to the prior art.

Referring initially to FIG. 1, a known architecture of a 3.3V Schmitt trigger circuit 10 using 1.8V devices is shown. The circuit 10 includes a protection or clipper device 12 to clip the signal on the signal input PAD at VREFH. A low voltage inverter 14 inverts the signal which is further inverted by inverter 16 to construct the output. As discussed above, there is active power consumption from the PAD during the transition which can lead to operational failures. Also, this architecture cannot fully support the CMOS standard which includes: Logic Low (VIL)≤0.35*VDDE; and Logic High (VIH)≥0.65*VDDE.

Figure 2:
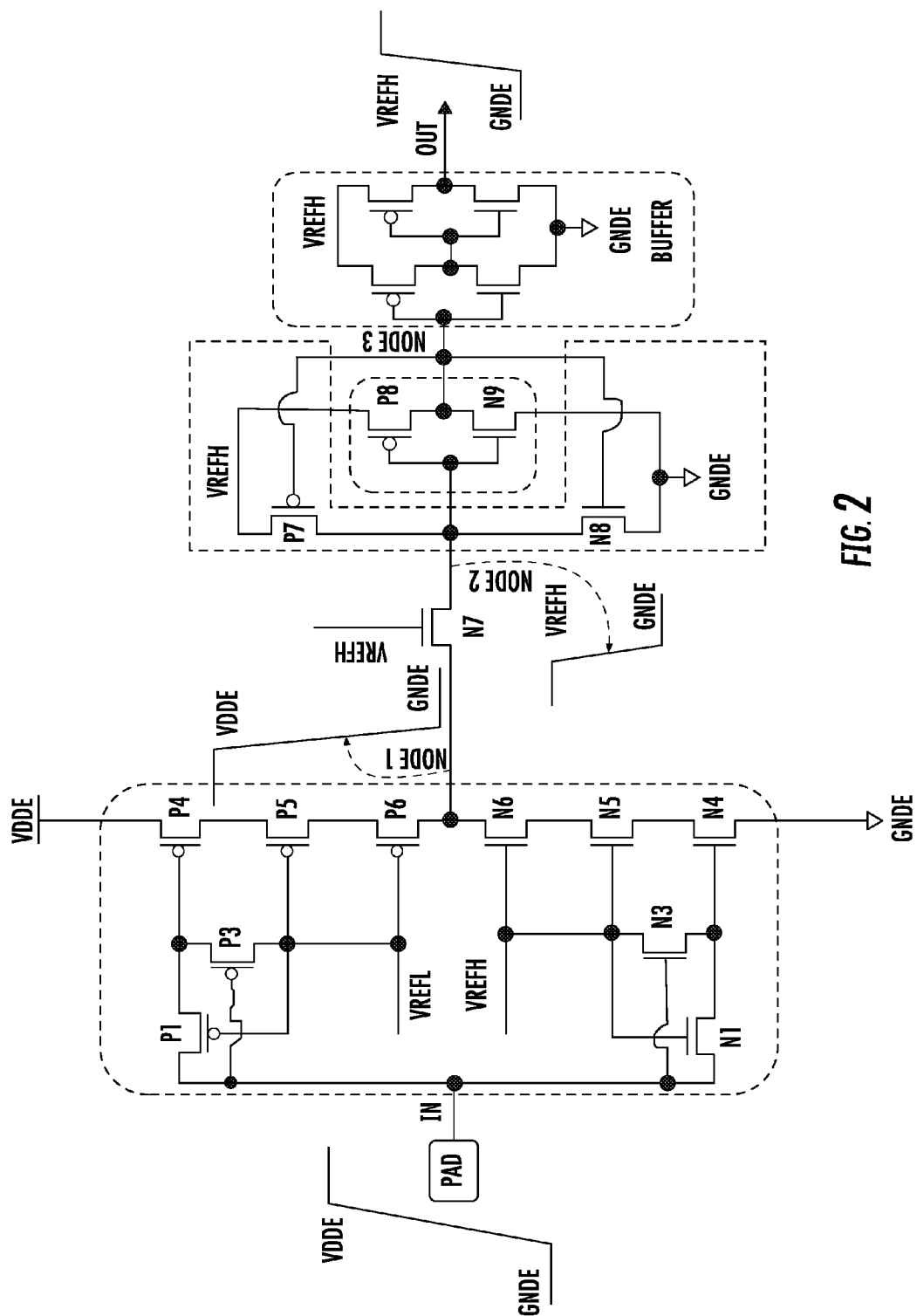
FIG. 2 is a schematic diagram illustrating a Schmitt trigger circuit according to a present embodiment.

Referring now to FIG. 2, a Schmitt trigger circuit 20 in accordance with features of the present embodiments, is now described. The circuit 20 uses a back-to-back inverter architecture with a first stage at VDDE (e.g. 3.3V) and a second stage at VREFH (e.g. 1.8V). The Schmitt trigger circuit 20 includes a signal input PAD, a first inverter 21 coupled to the signal input PAD and configured to operate at a first voltage (e.g. VDDE). A second inverter 24 is coupled downstream of the first inverter 21 and is configured to operate at a second voltage (e.g. VREFH or 1.8V) which is lower than the first voltage (VDDE or 3.3V) and may be generated internally from first supply voltage VDDE by using an internal reference voltage generator.

A protection device 22 is coupled between the first inverter 21 and the second inverter 24, and is configured to limit voltage input to the second inverter 24 at the second voltage (VREFH). A feedback circuit 28 (e.g. a positive feedback latch) is coupled downstream of the protection device 22 between the first inverter 21 and the second inverter 24 and configured to introduce hysteresis. An output circuit 26 or buffer is coupled to the second inverter 24 and configured to provide an output signal OUT at the second voltage (VREFH). As may be appreciated, there are no active devices sourcing or sinking the current from the PAD during transition and hence there will be no active power consumption from PAD during the transition.

The first inverter 21 may include a plurality of transistor devices P1-P6 and N1-N6 configured to operate at the second voltage (e.g. 1.8V transistor devices). Transistor devices P4-P6 and N4-N6 define a series of cascode coupled transistor devices, and are coupled between the supply voltage VDDE and ground GNDE. As such, the cascade connection protects the 1.8V devices from the higher 3.3V input signal. The protection device 22 may include a transistor clipping circuit (e.g. transistor device N7) controlled by a first reference voltage VREFH which corresponds to the second voltage (e.g. 1.8V).

In FIG. 2 the gate of NMOS devices N5 and N6 in first inverter 21 is connected to the first internal reference voltage VREFH which protects these devices from overvoltage stress. Here this is just one representation, but it is not limited to only this. Depending upon the need there are multiple variants possible for such configurations, e.g. N5 and N6 can be replaced with single NMOS device or along with N5 and N6 there could be additional devices in cascade whose gate are connected to some other reference voltage which is not shown in FIG. 2 to simplify the architecture.

In FIG. 2 the gate of PMOS devices P5 and P6 in the first inverter 21 is connected to the second internal reference voltage VREFL which protects these devices from overvoltage stress. Here this is just one representation, but it is not limited to only this. Depending upon the need there are multiple variants possible for such configurations, like P5 and P6 can be replaced with a single PMOS device or along with P5 and P6 there could be additional devices in cascade whose gate are connected to some other reference voltage which is not shown in FIG. 2 to simplify the architecture.

The NMOS transistor device N1 of the first inverter 21 is used to protect the NMOS transistor device N4 from overvoltage stress when input voltage on PAD is logic high. Similarly the PMOS transistor device P1 of the first inverter 21 is used to protect the PMOS transistor device P4 from over-voltage stress when input signal on PAD is logic low.

The NMOS transistor device N3 in the first inverter 21 is used to pull up the gate of NMOS device N4 to first internal reference voltage VREFH level when the input signal on PAD is logic high. Similarly the PMOS transistor device P3 of the first inverter 21 is used to pull down the gate of PMOS device P4 to second internal reference voltage VREFL level when input signal on PAD is logic low.

Thus, as discussed above, the first inverter 21, the second inverter 24, the protection device 22, the feedback circuit 28 and the output circuit 26 may each include the use of 1.8V transistor devices, e.g. coupled as shown, and the first voltage level may be 3.3V. The Schmitt trigger circuit 20 complies with the CMOS standard of: Logic Low (VIL) =0.35*VDDE; and Logic High (VIH)=0.65*VDDE.

During transition from logic low to logic high when the input voltage on PAD is lower than the threshold voltage of NMOS transistor device N4, this device will be OFF and hence no current will flow from N4-N6. However since the input voltage is logic low therefore the PMOS transistor devices P4-P6 will be ON and hence the voltage at Node 1 will be at VDDE level. The VDDE level voltage on Node 1 will force the Node 2 to VREFH voltage level and Node 3 to GNDE level. The voltage level on Node 3 will pass to the output via buffer 26 to make the output voltage on Node OUT at GNDE level. When input voltage on PAD reaches the logic low to logic high switching threshold VIH of the Schmitt, the devices N4-N6 will be turned ON and the voltage on Node 1 will switch from VDDE level to GNDE level. The GNDE level voltage on Node 1 will force the Node 2 voltage also at GNDE level which will force the voltage on Node 3 to VREFH level. The voltage level on Node 3 will pass to the output via buffer 26 to make the output voltage on Node OUT to VREFH level.

During transition from logic high to logic low when the input voltage on PAD is higher than the VDDE-Vthp (threshold voltage of PMOS transistor device P4), the device P4 will be OFF and hence no current will flow from P4-P6. However since the input voltage is logic high therefore the NMOS transistor devices N4-N6 will be ON and hence the voltage at Node 1 will be at GNDE level. The GNDE level voltage on Node 1 will force the Node 2 to GNDE voltage level and Node 3 to VREFH level. The voltage level on Node 3 will pass to the output via buffer 26 to make the output voltage on Node OUT to VREFH level. When input voltage on PAD reaches the logic high to logic low switching threshold VIL of the Schmitt, the devices P4-P6 will be turned ON and the voltage on Node 1 will switch from GNDE level to VDDE level. The VDDE level voltage on Node 1 will force the Node 2 voltage to VREFL level which will force the voltage on Node 3 to GNDE level. The voltage level on Node 3 will pass to the output via buffer 26 to make the output voltage on Node OUT at GNDE level.

The PMOS transistor device P7 and NMOS transistor device N8 of feedback circuit 28 are used to adjust the switching threshold of the Schmitt. The PMOS transistor device P7 will be used to adjust the logic low to logic high switching threshold VIH of the Schmitt. The NMOS transistor device N8 will be used to adjust the logic high to logic low switching threshold VIL of the Schmitt.

The PMOS transistor device P8 and NMOS transistor device N9 forms the second inverter for the Schmitt which is connected between the second supply and ground.

Figure 3:
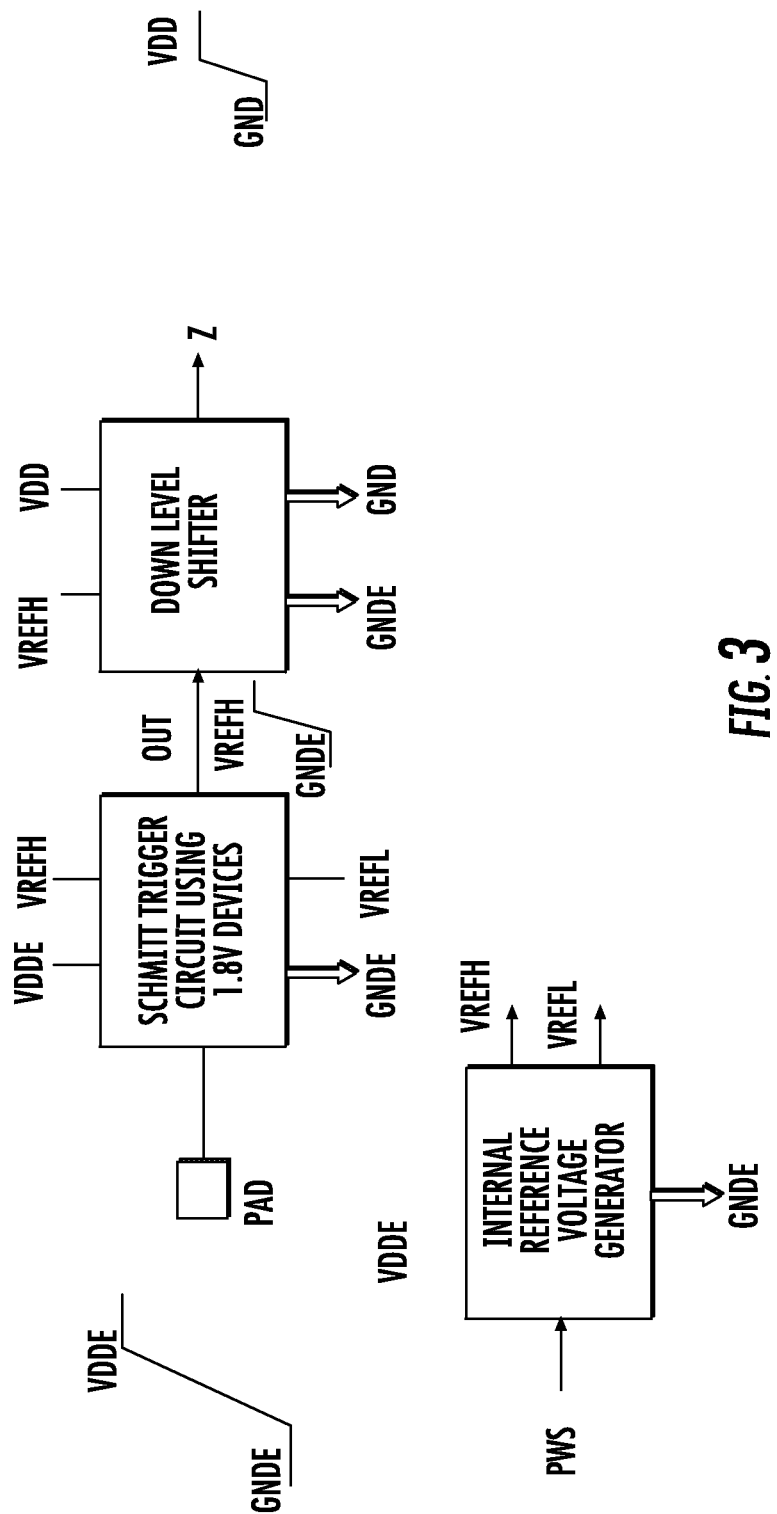
FIG. 3 is a block diagram illustrating a CMOS input/output (I/O) receiver including the Schmitt trigger circuit of FIG. 2.
Figure 4:
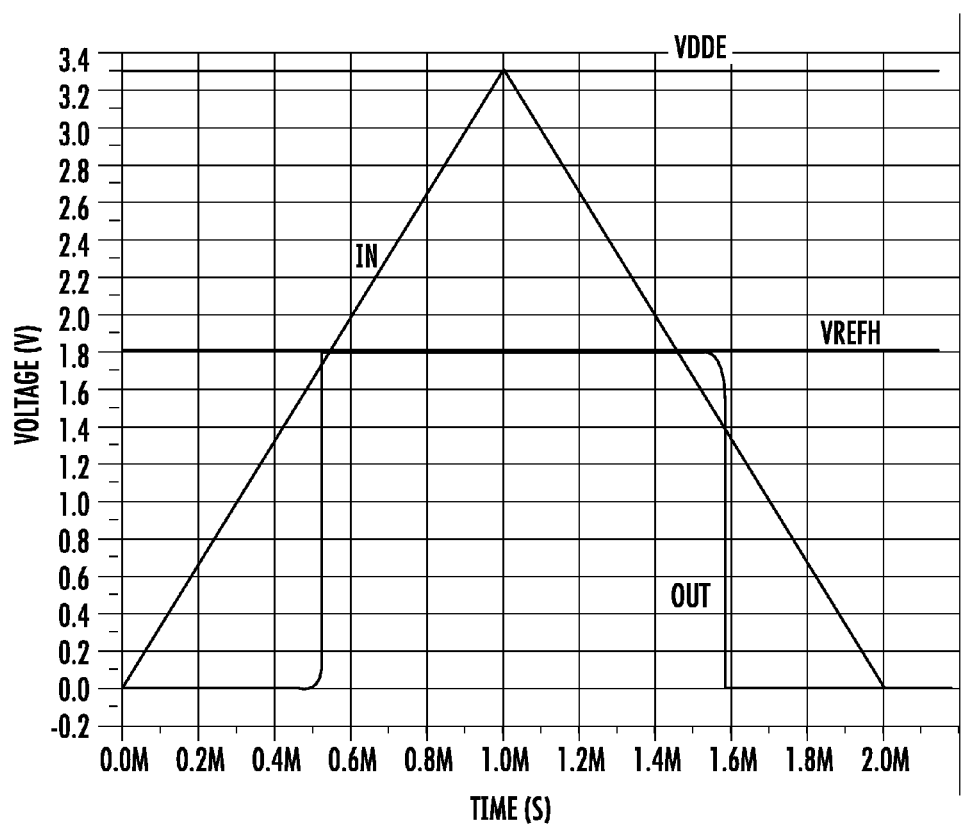
FIG. 4 is a graph illustrating a simulated waveform for the Schmitt trigger circuit of FIG. 2.

Referring additionally to FIG. 3, a CMOS input/output (I/O) receiver 30 is now described. The receiver 30 includes an I/O pad, the Schmitt trigger circuit 20 coupled to the I/O pad, a down level shifter device 32 coupled to the Schmitt trigger circuit, and an internal reference voltage generator 34 configured to generate the first reference voltage VREFH and second reference voltage VREFL for the Schmitt trigger circuit 20 and the down level shifter device 32 based upon a supply voltage VDDE.

A method aspect is directed to implementing a Schmitt trigger circuit 20. The method includes: coupling a first inverter 21, configured to operate at a first voltage, to a signal input PAD; coupling a second inverter 24 downstream of the first inverter 21 and configured to operate at a second voltage lower than the first voltage; coupling a protection device 22 between the first inverter 21 and the second inverter 24 to limit voltage input to the second inverter at the second voltage; coupling a feedback circuit 28 downstream of the protection device 22 between the first inverter 21 and the second inverter 24 to introduce hysteresis; and coupling an output circuit 26 to the second inverter 24 to provide an output signal OUT at the second voltage.

The above described approach may be implemented in all wide supply I/Os implemented in 28 nm bulk CMOS and 28 nm FDSOI, for example. The approach is applicable to any high voltage design using low voltage devices.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A Schmitt trigger circuit comprising:
a signal input;
a first inverter coupled to the signal input and configured to operate at a first voltage;
a second inverter coupled downstream of the first inverter and configured to operate at a second voltage lower than the first voltage;
a protection device coupled between the first inverter and the second inverter, and configured to limit a voltage input to the second inverter at the second voltage;
a feedback circuit coupled downstream of the protection device between the first inverter and the second inverter and configured to introduce hysteresis; and
an output circuit coupled to the second inverter and configured to provide an output signal at the second voltage.

2. The Schmitt trigger circuit according to claim 1 wherein the first inverter comprises a plurality of transistor devices configured to operate at the second voltage and coupled together.

3. The Schmitt trigger circuit according to claim 2 wherein the plurality of transistor devices of the first inverter comprises a series of cascode coupled transistor devices to protect the devices from over-voltage stress.

4. The Schmitt trigger circuit according to claim 3 wherein the series of cascade coupled transistor devices of the first inverter is coupled between a first supply voltage and ground.

5. The Schmitt trigger circuit according to claim 1 wherein the protection device comprises a transistor clipping circuit controlled by a first reference voltage which corresponds to the second voltage.

6. The Schmitt trigger circuit according to claim 1 wherein the first inverter, the second inverter, the protection device, the feedback circuit and the output circuit each comprises 1.8V transistor devices, and the first voltage level is 3.3V.

7. The Schmitt trigger circuit according to claim 1 wherein the feedback circuit comprises a positive feedback latch.

8. A CMOS input/output (I/O) receiver comprising:
an I/O pad;
a Schmitt trigger circuit coupled to the I/O pad;
a down level shifter device coupled to the Schmitt trigger circuit; and
an internal reference voltage generator configured to generate reference voltages for the Schmitt trigger circuit and the down level shifter device based upon a supply voltage;
the Schmitt trigger circuit comprising
a first inverter coupled to the I/O pad and configured to operate at a first voltage,
a second inverter coupled downstream of the first inverter and configured to operate at a second voltage lower than the first voltage,
a protection device coupled between the first inverter and the second inverter, and configured to limit a voltage input to the second inverter at the second voltage,
a feedback circuit coupled downstream of the protection device between the first inverter and the second inverter and configured to introduce hysteresis, and
an output circuit coupled to the second inverter and configured to provide an output signal at the second voltage to the down level shifter device.

9. The CMOS input/output (I/O) receiver according to claim 8 wherein the first inverter comprises a plurality of transistor devices configured to operate at the second voltage level and coupled together.

10. The CMOS input/output (I/O) receiver circuit according to claim 9 wherein the plurality of transistor devices of the first inverter comprises a series of cascode coupled transistor devices to protect the devices from over-voltage stress.

11. The CMOS input/output (I/O) receiver according to claim 10 wherein the series of cascode coupled transistor devices of the first inverter is coupled between the first supply voltage and ground.

12. The CMOS input/output (I/O) receiver according to claim 8 wherein the protection device comprises a transistor clipping circuit controlled by a first reference voltage from the internal reference voltage generator which corresponds to the second voltage.

13. The CMOS input/output (I/O) receiver according to claim 8 wherein the first inverter, the second inverter, the protection device, the feedback circuit and the output circuit each comprise 1.8V transistor devices, and the first voltage level is 3.3V.

14. The CMOS input/output (I/O) receiver according to claim 8 wherein the feedback circuit comprises a positive feedback latch.

15. A method of implementing a Schmitt trigger circuit, the method comprising:
coupling a first inverter, configured to operate at a first voltage, to a signal input;
coupling a second inverter downstream of the first inverter and configured to operate at a second voltage lower than the first voltage;
coupling a protection device between the first inverter and the second inverter to limit voltage input to the second inverter at the second voltage;
coupling a feedback circuit downstream of the protection device between the first inverter and the second inverter to introduce hysteresis; and
coupling an output circuit to the second inverter to provide an output signal at the second voltage.

16. The method according to claim 15 wherein coupling the first inverter comprises providing a plurality of transistor devices configured to operate at the second voltage level and coupled together.

17. The method according to claim 16 wherein providing the plurality of transistor devices of the first inverter comprises coupling a series of transistor devices in a cascade arrangement to protect the devices from over-voltage stress.

18. The method according to claim 17 wherein the series of cascode coupled transistor devices of the first inverter is coupled between a first supply voltage and ground.

19. The method according to claim 15 wherein coupling the protection device comprises providing a transistor clipping circuit controlled by a first reference voltage which corresponds to the second voltage.

20. The method according to claim 15 wherein the first inverter, the second inverter, the protection device, the feedback circuit and the output circuit each comprise 1.8V transistor devices, and the first voltage level is 3.3V.

21. The method according to claim 15 wherein coupling the feedback circuit comprises providing a positive feedback latch.

* * * * *

UNITED STATES PATENT AND TRADEMARK OFFICE
CERTIFICATE OF CORRECTION

| | | |
|---|---|---|
| PATENT NO. | : 9,467,125 B2 | Page 1 of 1 |
| APPLICATION NO. | : 14/573129 | |
| DATED | : October 11, 2016 | |
| INVENTOR(S) | : Kumar et al. | |

It is certified that error appears in the above-identified patent and that said Letters Patent is hereby corrected as shown below:

In the Specification

Column 1, Line 63:   Delete: "cascade"
                     Insert --cascode--

Column 3, Line 32:   Delete: "cascade"
                     Insert --cascode--

Column 3, Line 45:   Delete: "cascade"
                     Insert --cascode--

Column 3, Line 55:   Delete: "cascade"
                     Insert --cascode--

In the Claims

Column 5, Line 53,   Delete: "cascade"
Claim 4:             Insert --cascode--

Column 7, Line 7,    Delete: "cascade"
Claim 17:            Insert --cascode--

Signed and Sealed this
Twenty-seventh Day of December, 2016

Michelle K. Lee
*Director of the United States Patent and Trademark Office*